United States Patent
Deshpande et al.

(10) Patent No.: US 8,516,413 B1
(45) Date of Patent: Aug. 20, 2013

(54) COMPILATION AND SIMULATION OF A CIRCUIT DESIGN

(75) Inventors: Sandeep S. Deshpande, Longmont, CO (US); Hem C. Neema, Sunnyvale, CA (US); Valeria Mihalache, Santa Clara, CA (US); Kumar Deepak, San Jose, CA (US); Sonal Santan, San Jose, CA (US); David K. Liddell, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/468,933

(22) Filed: May 10, 2012

(51) Int. Cl.
*G06F 9/45* (2006.01)

(52) U.S. Cl.
USPC .......................................................... 716/103

(58) Field of Classification Search
USPC .......................................................... 716/103
See application file for complete search history.

(56) References Cited

U.S. PATENT DOCUMENTS

| 7,080,365 | B2 | 7/2006 | Broughton et al. | |
|---|---|---|---|---|
| 2004/0162717 | A1* | 8/2004 | Nouri et al. | 703/17 |
| 2005/0198606 | A1 | 9/2005 | Gupta et al. | |
| 2007/0245277 | A1 | 10/2007 | Chen | |
| 2010/0153083 | A1* | 6/2010 | Bobok et al. | 703/13 |
| 2012/0233578 | A1* | 9/2012 | Karlsson | 716/106 |

OTHER PUBLICATIONS

U.S. Appl. No. 13/347,301, filed Jan. 10, 2012, Mihalache et al.
U.S. Appl. No. 13/468,468,927, filed May 10, 2012, Neema et al.
U.S. Appl. No. 13/468,942, filed May 10, 2012, Santan et al.

* cited by examiner

*Primary Examiner* — Vuthe Siek
*Assistant Examiner* — Mohammad Alam
(74) *Attorney, Agent, or Firm* — LeRoy D. Maunu

(57) ABSTRACT

One or more embodiments provide a method of HDL simulation that determines dependencies, forcing characteristics, and strength characteristics of nets for the entire circuit design during compilation. Simulation code and data structures are generated for each net, individually, based on the determined characteristics of the respective net. As a result, rather than implementing code for simulation of each net capable of handling every possible combination of the characteristics, less complex code and data structures may be generated for simulation of the nets.

20 Claims, 6 Drawing Sheets

COMPILATION AND SIMULATION OF A CIRCUIT DESIGN

FIELD OF THE INVENTION

One or more embodiments generally relate to the simulation of circuit designs.

BACKGROUND

Due to advancements in processing technology, complex integrated circuits (ICs) can be designed at various levels of abstraction. Using a hardware description language (HDL), circuits can be designed at the gate level, the register transfer level (RTL), and higher logical levels. When designing using an HDL, the design is often structured in a modular manner. The designer describes a module in terms of the behavior of a system, the behavior describing the generation and propagation of signals through modules of combinatorial logic from one set of registers to another set of registers. HDLs provide a rich set of constructs to describe the functionality of a module. Modules may be combined and augmented to form even higher-level modules.

Prior to implementation, an HDL-based design can be simulated to determine whether the design will function as required. Wasted manufacturing costs due to faulty design may thereby be avoided. Numerous tools are available for simulating circuit designs including, for example, high-level modeling systems (HLMS) and HDL simulators.

Simulation of an HDL-based design comprises a compilation phase and a runtime simulation phase. In the compilation phase, HDL source code is input, analyzed, and elaborated to generate executable simulation code. In the runtime simulation phase, the code generated in the compilation phase is executed by a simulation engine to simulate the design.

From a user perspective, HDL simulators work by compiling the HDL-based design once, and then executing the compiled design many times during the runtime phase. Therefore, the runtime performance of HDL simulators is of critical importance, and may be more important than compile time performance.

An HDL-based design is a hierarchy of modules whose behavior is described by HDL processes. When the HDL-based design is written in VHDL, an HDL process corresponds to either a VHDL process, a concurrent signal assignment, or a concurrent assertion. When the HDL-based design is written in the Verilog language, an HDL process corresponds to either a Verilog always block, an initial block, an assign statement, or a gate. Procedure calls may or may not be regarded as HDL processes. From a hardware perspective, the HDL processes represent hardware that responds to changes in inputs. For example, a change to an output of one circuit may trigger responses in multiple circuits having inputs coupled to the output.

HDL simulators schedule execution of HDL statements such that global variables or signals input to the HDL statements are properly updated and race conditions between concurrent HDL statements are avoided. Simulation of HDL processes is performed over a number of simulation cycles. Each simulation cycle begins with updates to values of nets. Each net, which may be a VHDL signal or a Verilog net, represents values transmitted on a wire of a circuit design. For ease of reference, VHDL signals and Verilog nets may be referred to as either signals or nets, and such terms are used interchangeably herein. Each update to a net may trigger a number of processes which model how a hardware implementation of the design would respond. Processes dependent on the updated nets are scheduled and executed in a delta cycle.

Depending on the circuit design, a net may be changed or updated by the output of multiple processes. Each process output that may affect a net is referred to as a driver. If a process has several statements assigning values to the same net, only one driver for the net is created per process. The value of the driver is computed from all the values assigned to that signal in the process, according to predefined language rules. A net that has at most one driver for each bit is said to be singly-driven. A net that has several drivers on the same set of bits is said to be multiply-driven.

When a net is driven by multiple drivers, a value of the net is determined when nets are updated at runtime using a resolution function. The value computed by the resolution function is referred to as the resolved value, and the resolved value will be assigned as the new value of the net. The process of computing the new value from the driver values of a net is called driver resolution. The resolution function can be standard, defined by the HDL language itself or, for VHDL, can be user defined.

In addition, nets may model a level of strength of a driven logic signal. Signal strength levels may be modeled for some nets and not for others. Further, Verilog allows individual nets to be forced to a specified valued by a process during simulation. Forcing is performed using a force construct that effectively nullifies the effect of any other values driven on the signal and instead overrides the signal with a value specified by the force until a release construct reconfigures the net to again be affected by the driver values.

Previous methods for simulation of HDL circuit designs compile the designs and generate simulation code on a module-by-module basis, with no regard to different dependencies, strengths, and forcing characteristics of different nets. Rather, such characteristics are determined and processed dynamically at simulation runtime. As a result, the simulation code for modeling of nets generated by the previous compilation methods must be general enough to be capable of handling all net characteristics including forcing and strength modeling. Large data structures of pointers are created to store the values, strengths, forced status, and dependencies of drivers and nets. These data structures require a significant amount of memory to store data values and pointers between the data structures.

The complex data structures of the prior approaches are computationally inefficient for nets of the circuit design that do not model all characteristics. Furthermore, when data structures are dynamically created, the memory needed to store the various data values is allocated at runtime. Due to the dynamic allocation of memory, data needed for various computations performed regularly during simulation may be stored in separate locations of memory. As a result, the simulation processes may have to separately and repeatedly access a large number of different locations of memory to retrieve all the required data. These separate memory accesses by the resolution function can significantly impact simulation runtime.

One or more embodiments may address one or more of the above issues.

SUMMARY

In one embodiment, a method for compiling a hardware description language (HDL) specification for simulation of a circuit design is provided. Using one or more processors, a circuit design is elaborated from the HDL specification. First nets of the elaborated circuit design that are not placed in a forced state during simulation are determined. Second nets of the elaborated circuit design that are placed in a forced state at some time during simulation are determined. Simulation code that models the circuit design is generated. The simulation code is configured to update one or more of the first nets during simulation using one or more respective update functions of a first type. Each function of the first type is configured to update a value of the net each time the update function is executed during simulation. The simulation code is configured to update the one or more of the second nets using one or more respective update functions of a second type during runtime. Each function of the second type is configured to update a value of the net only in response to the net being in the forced state at time of execution of the update function.

In another embodiment, a method for compiling a hardware description language (HDL) specification for simulation of a circuit design is provided. Using one or more processors, the circuit design is elaborated from the HDL specification. First nets of the elaborated circuit design, for which strength evaluation is required during simulation, and second nets of the elaborated circuit design, for which strength evaluation is not required during simulation, are determined. Simulation code that models the circuit design is generated. For each of the first nets, the simulation code is configured to perform strength resolution to update a resultant strength value of the net using an update function of a first type. For each of the second nets, the simulation code is configured to perform driver resolution to update a logic value of the net using an update function of a second type.

It will be appreciated that various other embodiments are set forth in the Detailed Description and Claims, which follow.

BRIEF DESCRIPTION OF THE DRAWINGS

Various aspects and advantages of the disclosed embodiments will become apparent upon review of the following detailed description and upon reference to the drawings, in which.

DETAILED DESCRIPTION

One or more embodiments provide a method of HDL simulation that determines dependencies, forcing characteristics, and strength characteristics of nets for the entire circuit design during compilation. Simulation code and data structures are generated for each net, individually, based on the determined characteristics of the respective net. As a result, rather than implement code for simulation of each net capable of handling every possible combination of the characteristics, less complex code and data structures may be generated for simulation of the nets.

In this manner, computation and memory resources required at simulation runtime are reduced. The additional compilation time imposed by this approach is offset by gains in runtime performance since HDL-based designs are typically simulated many times following compilation. The envisioned embodiments are applicable to circuit designs written in VHDL, Verilog, or a combination of VHDL and Verilog.

One or more embodiments provide a method of compiling an HDL specification for efficient modeling of forced nets. In simulation of an HDL circuit design, a force statement on a net is used to override all drivers of the net, including net-gate outputs, module outputs, and continuous assignments until a release procedural statement is executed on the net. When released, the net is updated to a value determined by the drivers of the net. A force statement effectively disconnects all other drivers for the net, leaving only the driver of the corresponding force statement connected and affecting the value of the net. A release statement reverses the effect of the "force." The release statement disconnects the driver corresponding to the force and effectively reconnects all other drivers so that the resulting value is determined by the resolution of those driver values. Force and release (as well as assign and de-assign, which are similar in operation to force and release) statements are frequently used in HDL circuit designs. For example, force and release statements may be used to initialize control signals or to perform set/reset operations under various circumstances.

In one or more embodiments, nets that are forced at some point during simulation are identified during compilation. For ease of reference, nets that are forced at some point during simulation may be referred to as forcible nets. Similarly, nets that are not forced at any point during simulation may be referred to as non-forcible nets. Rather than generate the same generalized simulation code capable of handling both forcible nets and non-forcible nets, simulation code is generated that is tailored to the specific needs and characteristics of the respective net. For instance, in one embodiment, update functions of a first type are generated for forcible nets, and update functions of a second type are generated for non-forcible nets.

Figure 1:
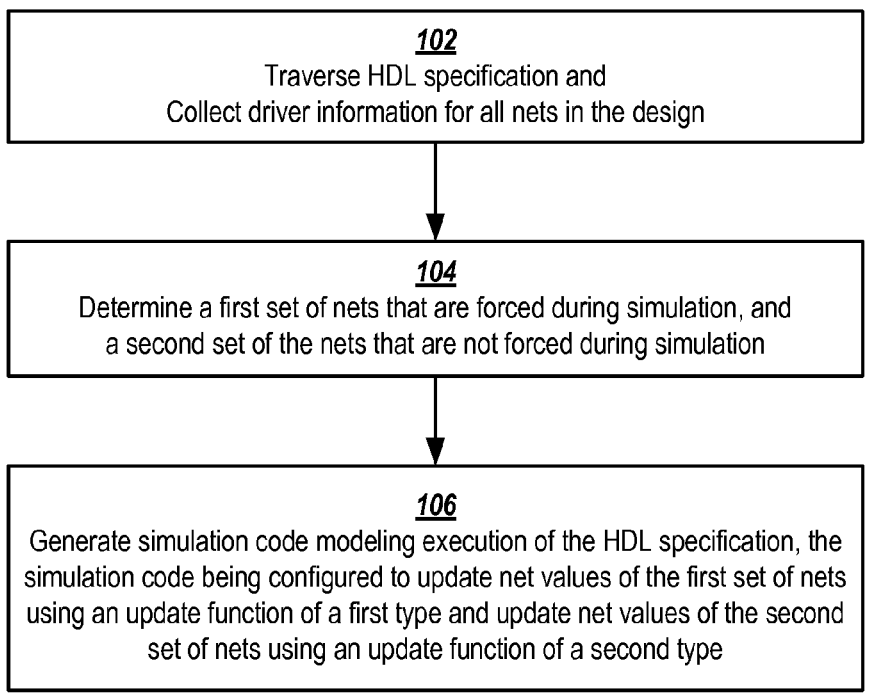
FIG. 1 shows a process for compiling HDL designs for efficient processing of forced nets, in accordance with one or more embodiments.

FIG. 1 shows a flowchart of a process for compiling an HDL specification in accordance with one or more embodiments. An HDL circuit design specification is traversed at block 102, and driver information is collected for all nets of the design. For each net, at block 104 the process determines a first set of the nets that are forced at some point during simulation and a second set of nets that are not forced during simulation. Simulation code that models execution of the HDL specification is generated at block 106. The simulation code is configured to update values of the first set of nets (i.e., forcible nets) using a first type of update function and update values of the second set of nets (i.e., non-forcible nets) using a second type of update function. The update functions of the first type are configured to update a value of a net only in response to the net being in the forced state at the time of execution of the update function. Each update function of the second type is configured to update a value of a net each time the update function is executed.

In addition to distinguishing nets based on forcibility of the nets during simulation, some embodiments may identify additional force/release characteristics that may be used to further optimize simulation code for memory and runtime efficiency. For instance, the compilation process may identify various characteristics of forcible nets including, whether the forced value of the net is constant or dynamic, whether the forcible net is singly driven or multiply driven, and whether all bits of the net are forced in unison or some bits of the net are forced independent of other bits in the net, etc.

In some embodiments, a data structure is created for each net that indicates the force/release characteristics of the particular net. The data structures may include, for example, information used to track various aspects of the force/release characteristics, such as: status of the net, pointer to a process or a list of processes that are forcing, lists of forced bits for bitwise force/release, list of processes forcing different bits, etc. For each net, code is generated to implement a respective update function that is specifically configured to model a net having the force/release characteristics indicated by the data structure.

In some embodiments, update functions for forcible nets may be configured differently based on whether the net is a singly-driven or a multiply-driven net. For instance, in some embodiments driver resolution is not performed for a multiply-driven net while a force on the net is in effect. Rather, the update function stores appropriate values in the corresponding driver locations so that it can be resolved when the force is released. Thus, processing time is not wasted performing driver resolution at times when the resolved value is not utilized. When a forced net is released, the net update function calls a driver resolution function so that the net is updated with a new value. For a singly-driven net, driver resolution does not need to be performed when the net is released from a forced state because there is only one driver. Instead, while the net is forced, the correct value of the net can be buffered and updated as the driver changes using a separate buffer memory location. When the net is released, the buffered value may be copied into the memory location where the value of the net is stored.

In some embodiments, update functions for forcible nets may be configured differently based on whether bits of the net are forced as a group or forced individually. In other words, nets forced as a group may be updated with a type of update function that is different than a type of update function used to update nets that are forced individually. For nets having bits that are placed in the forced state as a group, the net may be allocated one memory location for the net to store a value indicating whether the net is in the forced state or the non-forced state. For nets having bits that are individually placed in the forced state, a block of contiguous memory locations is assigned to store values indicating whether each bit is in the forced state or the non-forced state. Because nets having bits that are updated as a group do not have different forced statuses, simulation code and data structures for nets of this type can be implemented more efficiently with less complexity and fewer memory resources.

Similarly, in some embodiments, update functions for forcible nets may be configured differently based on whether bits of the net are forced to a constant value or to a dynamic value. In other words, nets forced to a constant value may be updated with a type of update function that is different than a type of update function used to update nets that are forced to dynamic values. Forcing to dynamic values requires more complex update functions to determine and update the forced value as controlling net values change. The complexity is further increased when individual bits of a net have forced values that dynamically change based on different sets of control signals. By generating different simulation code for nets having constant forced values and for nets having dynamic forced values, simulation efficiency can be increased.

Figure 2:
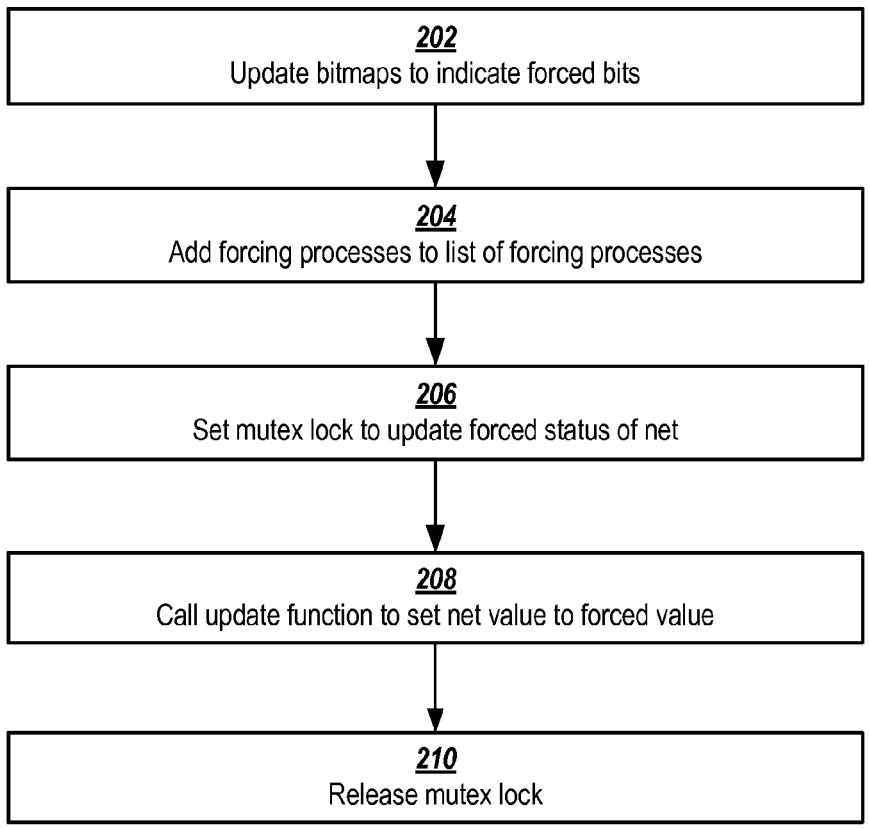
FIG. 2 shows a process for forcing a net during simulation, in accordance with one or more embodiments.

FIG. 2 shows a flowchart of a process for forcing a net during HDL simulation in accordance with one or more embodiments. Bitmaps are updated to indicate forced bits at block 202. Forcing processes are added to a list of forcing processes at block 204. The list of forcing processes may be used to trigger an update of the net while forced. For instance, if a forced value is dynamically changed based the output signal of a process, update of other nets by the process may require the forced value of the forced net to be updated.

A mutex lock is set to allow updating of forced status of the net at block 206. For instance, a mutex lock may be implemented by creating a flag for each net, and setting the flag to obtain a mutex lock on the forced status of the net. The update function is called to set the net value to the forced value at block 208. The mutex lock is released at block 210. Use of the mutex lock while updating the forced status of a net prevents an update function from changing the net values in the middle of setting the forced value and prevents processes from reading the value of the net until all bits have been updated to the forced value.

Figure 3:
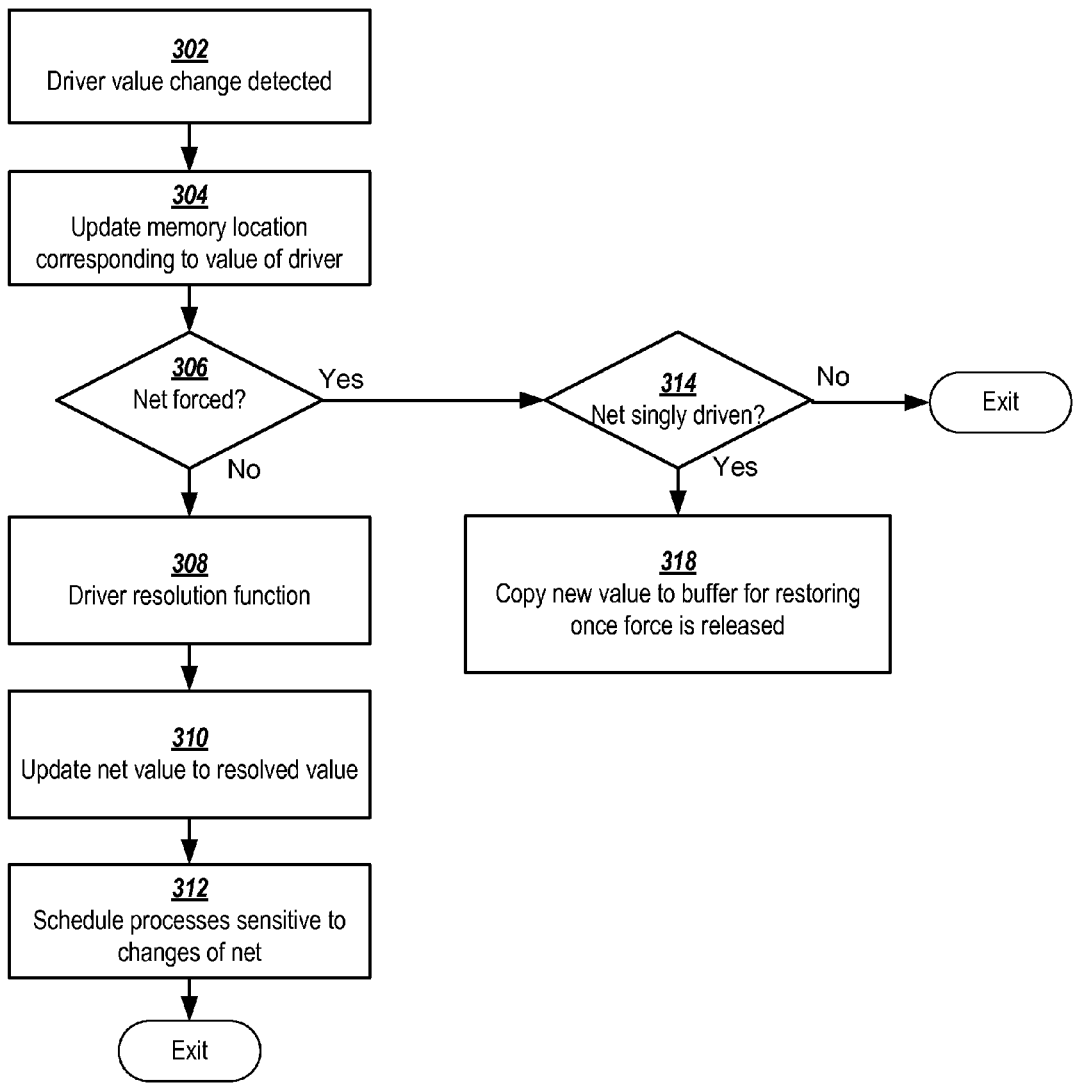
FIG. 3 shows a block diagram of a function for updating forced type nets, in accordance with one or more embodiments.

FIG. 3 shows a block diagram of a function for updating forcible type nets during simulation in accordance with one or more embodiments. Driver changes of a net are detected at block 302. The memory location corresponding to the value of the driver is updated to the new driver value at block 304. If the net is not in a forced state at decision block 306, the driver resolution function of the net is called at block 308, and the net is updated to the resolved value at block 310 by the driver resolution function. Processes sensitive to changes to the value of the net are scheduled at block 312. For ease of reference, the resolved value may be referred to as the resultant value, and such terms are used interchangeably herein.

If the net is in a forced state at block 306, different actions may be taken depending on whether or not the net is a singly-driven net. For singly-driven nets, the compiler allocates a second buffer memory location, and during simulation runtime, decision block 314 directs processing to block 318 where the update function copies the new net value to the buffer. When the net is later returned to a non-forced status, as discussed with reference to FIG. 4, the buffered value is used to update the net to the correct value.

For a multiply-driven forced net, the memory location used to store the value of the net is set to the forced value when forced. While forced, memory locations corresponding to the values of drivers of a net continue to be updated at block 304, but do not trigger the update function to perform driver resolution at decision step 306. When the net is later returned to a non-forced status, as discussed in reference to FIG. 4, the driver values should be current and driver resolution may be performed to update the net to the correct value.

Figure 4:
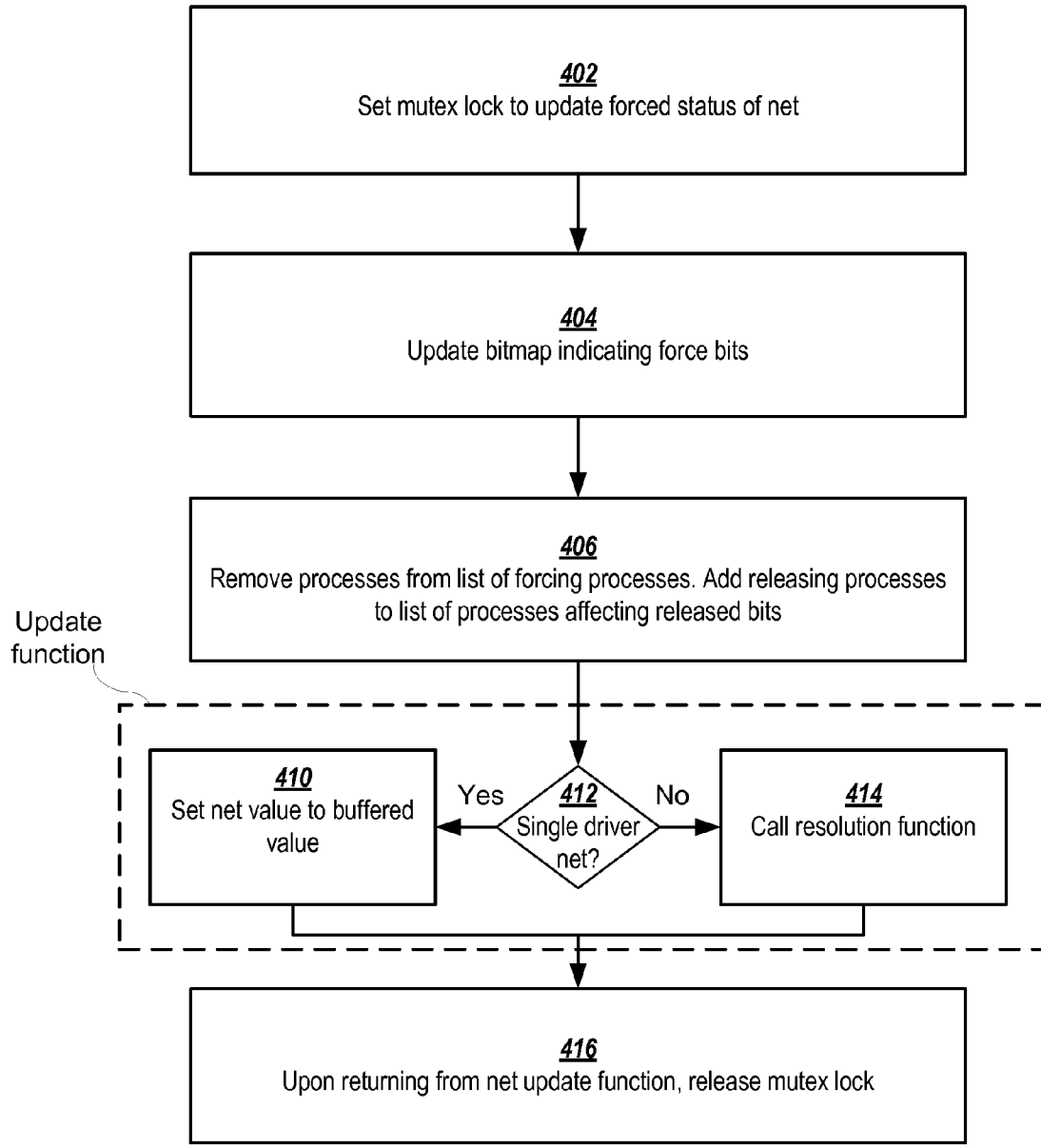
FIG. 4 shows a process for releasing a forced net during simulation, in accordance with one or more embodiments.

FIG. 4 shows a process for releasing a forced net during simulation. A mutex lock is set at block 402 to allow the forced status of the net to be updated. As described with reference to FIG. 2, use of the mutex lock while updating the forced status of a net prevents an update function from changing the net values in the middle of setting the forced value and also prevents processes from reading the value of the net until all bits have been updated to the forced value.

The bitmap indicating forced bits is updated at block 404 to no longer show the net as being forced. Corresponding processes are removed from the list of forcing processes at block 406. The removed processes are added to a list of processes affecting released bits. After the status has been updated, an update function of the net is called to update the value of the net.

As discussed above, the compiler may generate different update functions for a forcible net depending on whether the net is multiply or singly-driven. For singly-driven nets, the compiler allocates a second buffer memory location. During simulation runtime, the update function is configured to copy the new net value to the second buffer location as discussed with reference to FIG. 3. When the net is later returned to a non-forced status, as shown in FIG. 4, the process determines if the net is singly-driven or multiply-driven at decision block 412. For singly driven nets, the buffered value is used to update the net to the correct value at block 410. For multiply-driven nets, the memory location used to store the net value is set to the forced value when forced. While forced, memory locations corresponding to values of drivers of the net are updated as shown in FIG. 3. While forced, updates to the driver values do not trigger the update function to perform driver resolution. When the net is later returned to a non-forced status, as shown in FIG. 4, the driver values should be current and driver resolution may be performed at block 414 to update the net to the correct value. The mutex lock is released at block 416.

In one or more embodiments, the memory to be used to store force/release characteristics of the net and driver values may be statically allocated during compilation in order to avoid the need for dynamically allocating the memory during the runtime phase. For instance, for multiply-driven nets, allocation of contiguous memory to store driver values improves locality of memory locations used to store driver values needed to perform driver resolution. When all driver values of a bit are stored in adjacent memory locations, the values can be more efficiently loaded into cache memory at runtime, resulting in better cache performance.

In one or more embodiments, a method of compiling an HDL specification is provided for efficient modeling of driver strengths. One or more embodiments identify, during compilation, drivers and nets to be modeled using signal strength. Rather than generate the same generalized simulation code for updating each driver and net, different functions are generated that are tailored to the specific needs and characteristics of the respective net. For instance, in one embodiment, update functions of a first type are generated for nets for which strength is modeled, and update functions of a second type are generated for nets for which strength is not modeled.

In some embodiments, strength data is stored using a byte representation that allows resolved strengths and net values to efficiently be determined from the stored strength values during simulation. Because net values can be efficiently calculated from the strength values, some embodiments allocate memory for the nets (in which strength is modeled), to store the strength values but not memory to store net values. In some embodiments, update functions may be further customized for multiply-driven nets. For multiply-driven nets, strength is stored for each driver of the nets. A resolution function determines a resolved strength value of the net from the driver strength values. Using a table, a resolved net value can be determined from the resolved strength value.

Figure 5:
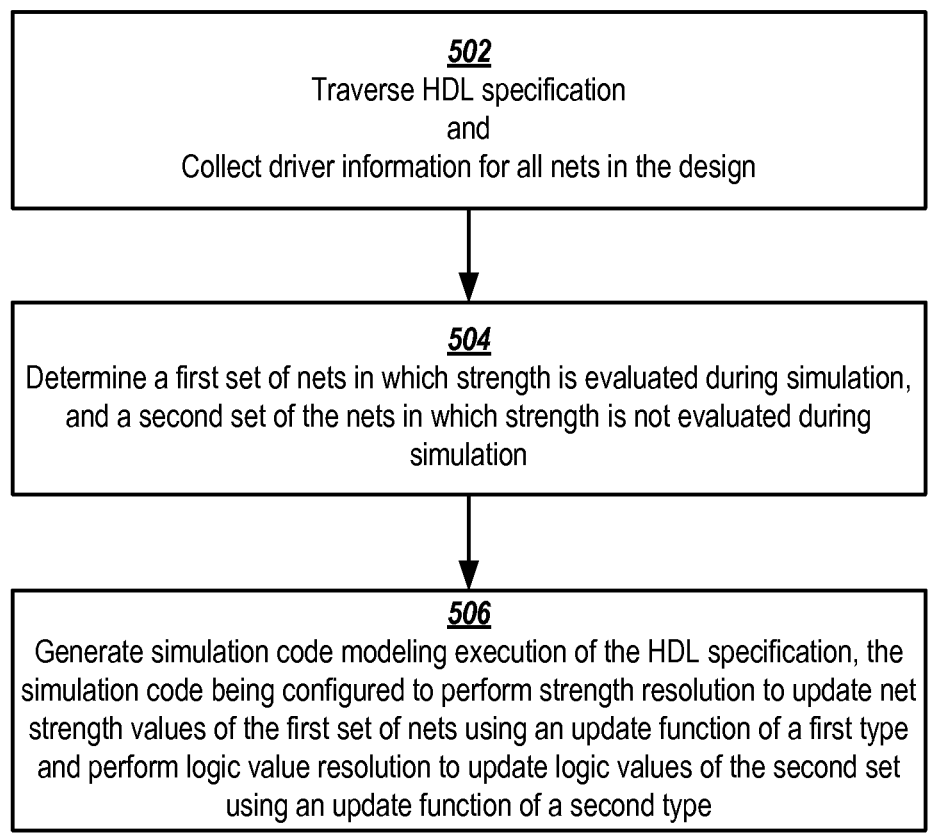
FIG. 5 shows a process for compiling HDL designs for efficient evaluation of net strength, in accordance with one or more embodiments.

FIG. 5 shows a flowchart of a process for compiling an HDL specification for efficient evaluation of net strengths, in accordance with one or more embodiments. An HDL circuit design specification is traversed at block 502 and driver information is collected for all nets of the design. For each net, at block 504, the process determines a first set of the nets in which strength is evaluated during simulation and a second set of nets in which strength is not evaluated during simulation.

Simulation code that models execution of the HDL specification is generated at block 506. The simulation code is configured to update net values of the first set of nets using update functions of a first type, and update net values of the second set of nets using update functions of a second type. Because separate types of update functions are used for the first and second sets of nets, the update functions can be generated using code that is specifically tailored to efficiently process nets with the strength characteristics of the respective set.

In some embodiments, the compiler is configured to efficiently allocate memory to nets to reduce memory required for simulation and improve simulation runtime. For each net that is identified as not modeling strength characteristics, memory is statically allocated to store the logical value of the net and associated driver values during simulation. Memory is not allocated to store strength values for the nets for which the strength is not modeled. For each net that is identified as modeling strength characteristics, memory is statically allocated to store net strength and associated driver strengths during simulation. For these nets, for which strength is modeled, memory is not allocated to store net and driver logical values of the nets during simulation.

The static assignment of memory avoids the need for dynamic allocation during the runtime phase. Multiply-driven nets are assigned contiguous blocks of memory to store either the values or strengths of the nets. The contiguous memory improves locality of reference to memory locations that store driver values used for driver resolution and strengths values used for strength resolution. For instance, a multiply-driven net configured to model strength may be allocated a contiguous block of memory to store strength values of all the drivers of the net. During strength resolution, the strength values are retrieved to determine a resolved strength value. The resolved strength value may then be converted to a net value. When all driver strengths of net are stored in adjacent memory locations, the values can be more efficiently loaded into the cache memory at runtime, resulting in better cache performance.

Figure 6:
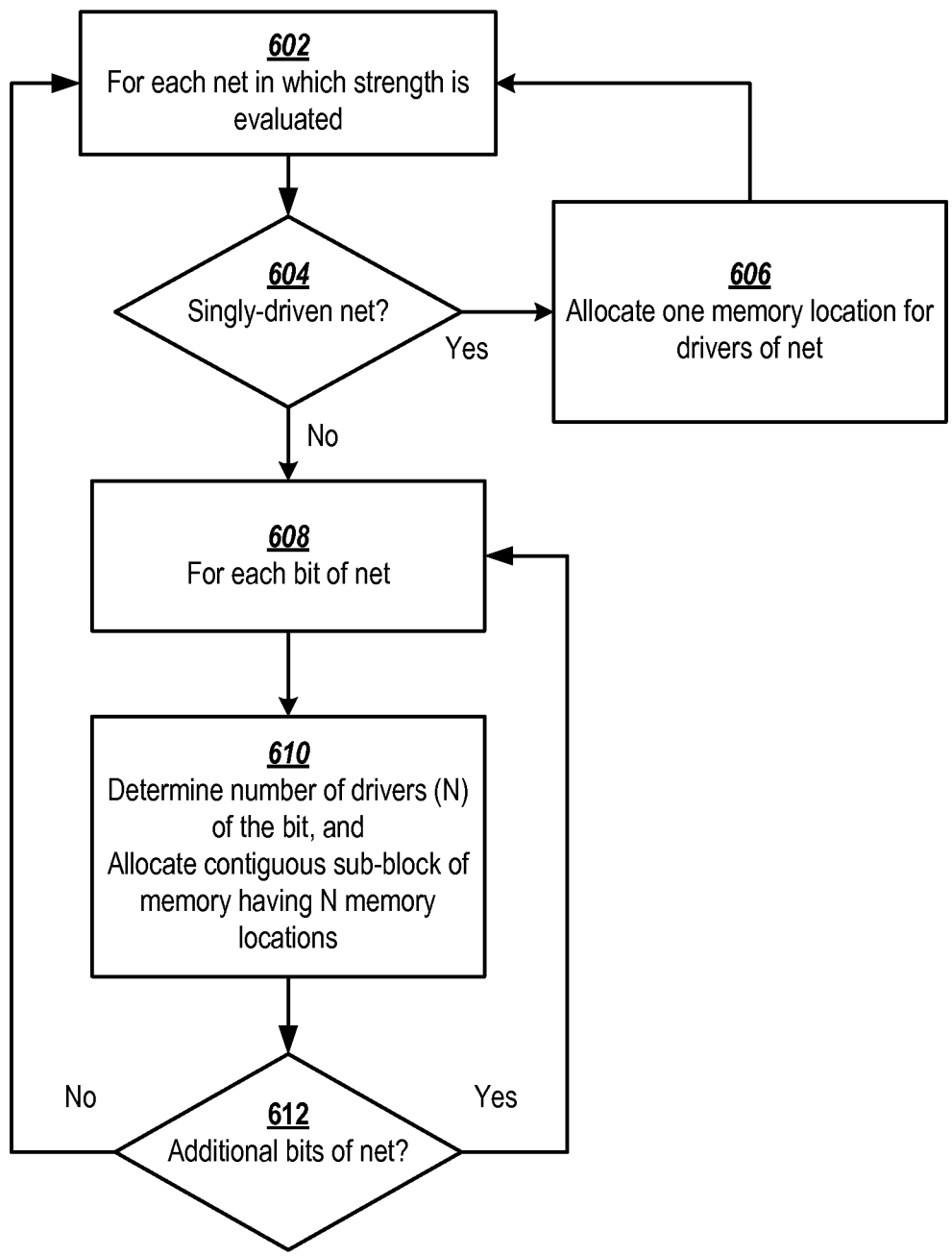
FIG. 6 shows a process for assigning contiguous memory blocks for efficient evaluation of net strength, in accordance with one or more embodiments.

FIG. 6 shows a process for assigning contiguous memory blocks for efficient evaluation of net strength. For each net in which strength is evaluated at block 602, it is determined whether the net is a singly-driven net at decision block 604. If the net is singly-driven, a memory location is allocated for the net at block 606. Otherwise, for each bit of the net, a contiguous block of memory is allocated at blocks 608, 610, and 612 to store the values of drivers of the bit. A similar process may be performed to further allocate contiguous memory blocks for multiply-driven nets, for which strength is not modeled.

In some embodiments, the net and driver strengths are stored in a format that facilitates efficient strength resolution and conversion to new values. There are two main types of signal strengths: driving strengths and charge strengths. Driving strengths can be supply, strong, pull, and weak, and charge strengths can be large, medium, and small. All strength specifications, with the exception of pullup and pulldown, have a strength1 specification (indicating the strength of an asserted logic 1 signal) and a strength0 specification (indicating the strength of an asserted logic 0 signal).

In one or more implementations, a driving strength of a gate or assignment is represented as one byte, with 4 bits representing the strength0 value and 4 bits representing the strength1 value. Each of the strength0 and strength1 parameters may have a value ranging from 0 to 7. Strength resolution determines a resultant strength having a strength_start parameter and a strength_end parameter.

The strength_start and strength_end values may be represented as one byte each, with strength_start and strength_end taking values from the set of values shown in table 1 (i.e., −7 to 7), such that strength_start<=strength_end.

TABLE 1

| Logic | Strength | Resultant value |
|---|---|---|
| Strength1 | Supply1 | 7 |
| | Strong1 | 6 |
| | Pull1 | 5 |
| | Large1 | 4 |
| | Weak1 | 3 |
| | Medium1 | 2 |
| | Small1 | 1 |
| | HiZ1 | 0 |
| Strength0 | HiZ0 | 0 |
| | Small0 | −1 |
| | Medium0 | −2 |
| | Weak0 | −3 |
| | Large0 | −4 |
| | Pull0 | −5 |
| | Strong0 | −6 |
| | Supply0 | −7 |

The resultant strength for a bit of a net is determined using the driver strength values. If driver values are not in contention, i.e., are all logic 1 or all logic 0, the strength_start and strength_end will both be set to the strongest of the driver strength for the logic value. If the value of the assigned values is ambiguous (i.e., value of the bit is unknown X), the resultant strength_start is set to the strongest strength0 of the drivers and the strength_end is set to the strongest strength1 of the drivers. A net value can be determined from the resultant strength by taking the absolute value of the numeric representations of the strength0 and strength1 values to determine which is larger.

The following Verilog statements provide an illustrative example of strength resolution of a 3-bit net w:
 wire [0:2] w;
 assign (weak0, pull1) #2 w=3'b1x1;
where the second statement assigns bits of net to the respective values of 1, X, and 1, with the strengths weak0 for strength0 assignment and pull1 for strength1 assignment. Using the values in Table 1, drive strength level of weak0 corresponds to a value of 3, and drive strength level of pull1 corresponds to a value of 5. To compute the resultant net strength value of the first bit of the net w (0), strength_start and strength_end values are both set to strength1, i.e., to 5, because the bit of the net is not ambiguous (e.g., assigned to logical 1). To compute resultant net strength value of the second bit w (1), which is assigned to an ambiguous value X, strength_start is set to −3 (the strength0 part corresponding to weak0), and strength_end is set to +5 (the strength1 part corresponding to pull1).

Figure 7:
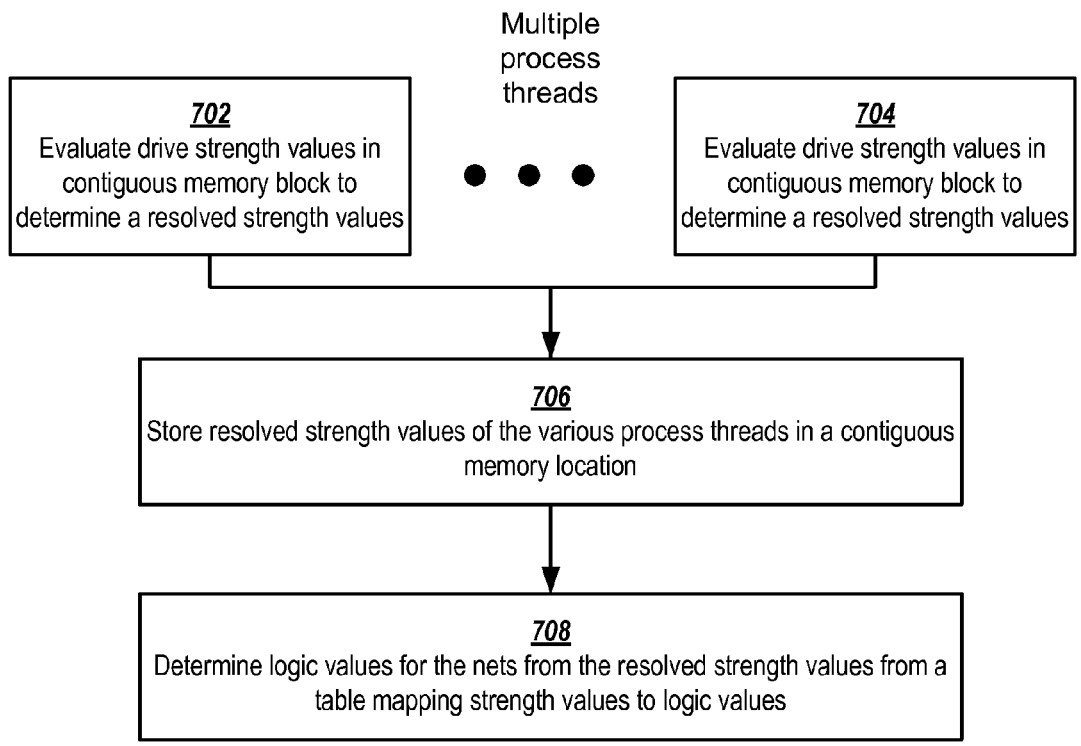
FIG. 7 shows an efficient process for determining logic values from strength values during simulation, in accordance with one or more embodiments.

This representation allows definition of a fast computation of the resolved strength and value from the driving strengths. If strength_start and strength_end have the same value, then the strength is unambiguous and the resolved strength can be efficiently computed from a set of driving strengths by comparing the absolute values of driving strengths and choosing the dominant value. If strength_start and strength_end have different signs, then the strength is ambiguous and then the value of the net is unknown X. The resolved strength can be efficiently computed from a set of driving strengths also in this case, by comparing the absolute values of the strength_start of the driving strengths and choosing the dominant value for the strength_start of the resolved strength, and similarly comparing the absolute values of the strength_end of the driving strengths and choosing the dominant value for the strength_end of the resolved strength FIG. 7 shows an efficient process for determining logic values from strength values during simulation runtime. Drive strength values in contiguous memory blocks are evaluated in one or more process threads (e.g., 702 and 704) to determine resolved strength values as discussed above. Resolved strength values of the process threads are stored in a contiguous memory location at block 706. Logic values of the nets are determined from the resolved strength values from a table mapping strength values to logic values at block 708.

In some embodiments, net values are determined from the resolved strength values using a conversion table. Due to the relatively small number of arguments for the conversion after resolution has been performed, conversion of resolved strength values to net values using a conversion table is a more efficient way of computing the performing conversion using a function. By pre-computing and storing in a table the values of the strength resolution function, processing efficiency is increased at the expense of a relatively marginal increase in memory requirements.

In some embodiments, resolution of driver strengths of a set of drivers in a net are performed two drivers at a time. In such embodiments, the resolution may be performed for different pairs of the set of drivers in parallel using a plurality of process threads. In some other embodiments, strength values of three or more drivers may be resolved at a time using a vector-based strength resolution. For implementations having all driver strengths of a bit stored in a contiguous block of memory, the resolution conversion process can perform resolution using a pointer to the contiguous block. Therefore, the number of arguments for the resolution function will be the same, regardless of the number of strength values that are resolved at a time by the process.

Figure 8:
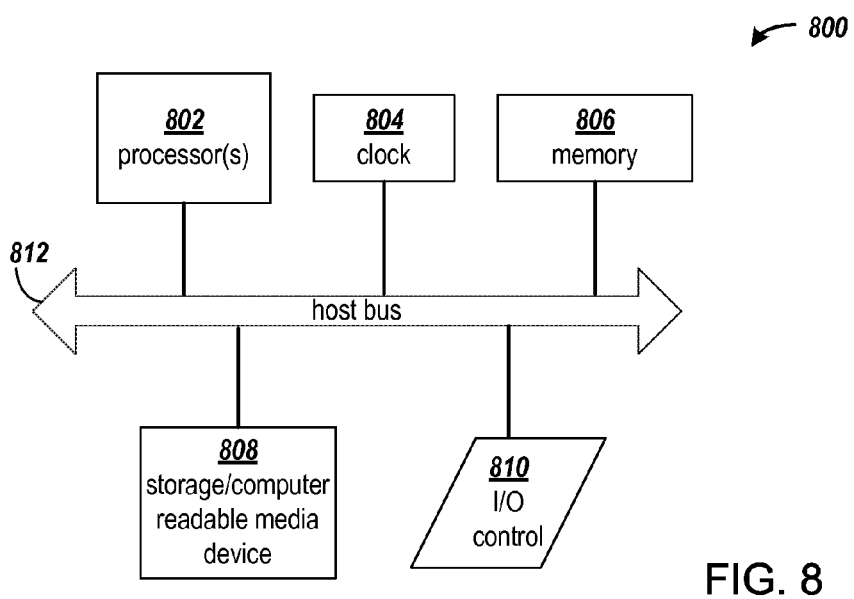
FIG. 8 shows a computing arrangement that may be configured to perform the processes of the various embodiments.

FIG. 8 shows a block diagram of an example computing arrangement that may be configured to implement the compilation and/or simulation processes described herein. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 800 includes one or more processors 802, a clock signal generator 804, a memory unit 806, a storage unit 808, and an input/output control unit 810 coupled to a host bus 812. The arrangement 800 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 802 may be one or more general purpose processors, or a combination of one or more general purpose processors and suitable co-processors, or one or more specialized processors (e.g., RISC, CISC, pipelined, etc.).

The memory arrangement 806 typically includes multiple levels of cache memory, and a main memory. The storage arrangement 808 may include local and/or remote persistent storage, such as provided by magnetic disks (not shown), flash, EPROM, or other non-volatile data storage. The storage unit may be read or read/write capable. Further, the memory 806 and storage 808 may be combined in a single arrangement.

The processor arrangement 802 executes the software in storage 808 and/or memory 806 arrangements, reads data from and stores data to the storage 808 and/or memory 806 arrangements, and communicates with external devices through the input/output control arrangement 810. These functions are synchronized by the clock signal generator 804. The resource of the computing arrangement may be managed by either an operating system (not shown), or a hardware control unit (not shown).

The embodiments may be applicable to a variety of systems for HDL simulation. Other aspects and embodiments will be apparent from consideration of the specification. It is intended that the specification and illustrated embodiments be considered as examples only, with a true scope of the embodiments being indicated by the following claims.

What is claimed is:

1. A method for compiling a hardware description language (HDL) specification for simulation of a circuit design, the method comprising:
   using one or more processors to perform operations including:
   elaborating the circuit design from the HDL specification;
   determining first nets of the elaborated circuit design that are not placed in a forced state during simulation, and second nets of the elaborated circuit design that are placed in a forced state at some time during simulation; and
   generating simulation code that models the circuit design, the simulation code configured and arranged to, during simulation runtime:
   update one or more of the first nets using one or more respective update functions of a first type, each function of the first type configured to update a value of the net each time the update function is executed; and
   update one or more of the second nets using one or more respective update functions of a second type, each function of the second type configured to update a value of the net only in response to the net being in the forced state at time of execution of the update function.

2. The method of claim 1, the operations further including:
   for each of the second nets, assigning a respective memory location to store a status indicating whether the net is in a non-forced state or in the forced state; and
   wherein the update function of the second type is configured and arranged to update the value of the net only in response to the status stored in the corresponding memory location indicating that the net is in the non-forced state.

3. The method of claim 1, the operations further including:
   determining singly-driven and multiply-driven nets of the elaborated circuit design;
   for each singly-driven net, assigning a respective memory location to store a value of a corresponding driver of the net at runtime; and
   for each multiply-driven net, assigning a contiguous block of memory to store values of corresponding drivers of the net at runtime;
   wherein the generating of the simulation code includes generating simulation code that during runtime, for each singly-driven net, stores the value of the corresponding driver of the singly-driven net in the respective memory location, and for each multiply-driven net, stores the values of the corresponding drivers in the assigned block of memory.

4. The method of claim 1, the operations further including:
   determining singly-driven and multiply-driven nets of the elaborated circuit design; and
   wherein for each multiply-driven net, the respective update function of the second type is configured and arranged to:
   in response to the net being in a forced state, update values of drivers of the net and set the value of the net to a forced value; and
   in response to the net being in a non-forced state, update values of drivers of the net, perform driver resolution to determine a value of the net, and set the value of the net to the determined value.

5. The method of claim 1, the operations further including:
   for each net of the second nets, determining if all bits of the net are placed in the forced state as a group during simulation; and
   wherein the update functions of the second type include a third type of update function and a fourth type of update function, and the generating of the simulation code includes generating code configured and arranged to, during simulation:
   update each of the second nets having bits placed in the forced state as a group using a respective update function of the third type; and
   update each of the second nets not placed in the forced state as a group using a respective update function of the fourth type.

6. The method of claim 5, the operations further including:
   for nets having bits that are placed in the forced state as a group at some time during simulation, assigning one memory location for the net to store a value indicating whether the net is in the forced state or the non-forced state; and
   for nets having bits that are individually placed in the forced state at some time during simulation, assigning a block of contiguous memory locations to store values indicating whether each bit is in the forced state or the non-forced state.

7. The method of claim 1, the operations further including:
   for each of the second nets, determining if the net has a constant forced value; and
   wherein the update functions of the second type include a third type of update function and a fourth type of update function, and for each second net, the respective update function of the second type is configured and arranged to:
   update each of the second nets having a constant forced value using a respective update function of the third type; and
   update each of the second nets not having a constant forced value using a respective update function of the fourth type.

8. A method for compiling a hardware description language (HDL) specification for simulation of a circuit design, the method comprising:
   using one or more processors to perform operations including:
   elaborating the circuit design from the HDL specification;
   determining first nets of the elaborated circuit design for which strength evaluation is required during simulation, and second nets of the elaborated circuit design for which strength evaluation is not required during simulation; and generating simulation code that models the circuit design, the simulation code configured and arranged to, during simulation runtime:

for each of the first nets, perform strength resolution to update a resultant strength value of the net using an update function of a first type; and for each of the second nets, perform driver resolution to update a logic value of the net using an update function of a second type.

9. The method of claim 8, the operations further including:
determining singly-driven and multiply-driven nets of the elaborated circuit design;
for each singly-driven net, assigning a respective memory location to store a logic or strength value of a corresponding driver of the net at runtime; and
for each multiply-driven net, assigning a contiguous block of memory to store logic or strength values of corresponding drivers of the net at runtime.

10. The method of claim 9, wherein for each multiply-driven net, the assigned contiguous block of memory is of a size sufficient to store strength values of drivers of each bit of the net.

11. The method of claim 8, wherein performing the strength resolution includes determining a logic value of the net using the resultant strength value of the net.

12. The method of claim 11, wherein the determining of the logic value of the net using the resultant strength value includes retrieving the logic value from a table mapping resultant strength values to logic values.

13. The method of claim 12, wherein performing the strength resolution includes accessing a table indicating resultant strength values and corresponding logic values.

14. The method of claim 12, wherein the strength value of each driver of one of the second nets includes at least one of a driving strength value or a charge strength value.

15. The method of claim 8, wherein the strength value of a driver includes a first 4-bit value indicating a first strength of the driver asserting logic 0 and a second 0-bit value of the driver indicating a second strength of the driver asserting a logic 1.

16. The method of claim 15, wherein the resultant strength on a net includes a byte indicating a largest one of the first strengths of two or more resolved nets and a second byte indicating a largest one of the second strengths of the two of more resolved nets.

17. The method of claim 16, wherein the first and second bytes have respective values selected from a set including {−7, −6, −5, −4, −3, −2, −1, 0, 1, 2, 3, 4, 5, 6, and 7}.

18. The method of claim 9, wherein the performing of the strength resolution includes determining a resultant strength based on an absolute value of a driving strength.

19. The method of claim 9, wherein the performing of the strength resolution includes, for each bit of the net, taking absolute values of a set of driving strength values of the bit to determine a resultant strength value of the bit.

20. The method of claim 8, wherein the simulation code is configured to perform strength resolution on two or more sets of drivers of a bit of a net in parallel using two of more process threads.

* * * * *